US010068947B2

United States Patent
Liu et al.

(10) Patent No.: US 10,068,947 B2
(45) Date of Patent: Sep. 4, 2018

(54) ARRAYS OF MEMORY CELLS AND METHODS OF FORMING AN ARRAY OF MEMORY CELLS

(71) Applicant: Micron Technology, Inc., Boise, ID (US)

(72) Inventors: Jun Liu, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/375,507

(22) Filed: Dec. 12, 2016

(65) Prior Publication Data

US 2017/0092695 A1    Mar. 30, 2017

Related U.S. Application Data

(62) Division of application No. 13/761,570, filed on Feb. 7, 2013, now Pat. No. 9,553,262.

(51) Int. Cl.
*H01L 27/24* (2006.01)
*H01L 45/00* (2006.01)

(52) U.S. Cl.
CPC ...... *H01L 27/2463* (2013.01); *H01L 27/2409* (2013.01); *H01L 45/065* (2013.01); *H01L 45/126* (2013.01); *H01L 45/1233* (2013.01); *H01L 45/144* (2013.01); *H01L 45/1683* (2013.01)

(58) Field of Classification Search
CPC .......................... H01L 29/24; H01L 45/1273
See application file for complete search history.

(56) References Cited

U.S. PATENT DOCUMENTS

| 8,022,382 | B2 | 9/2011 | Lai et al. |
| 9,299,930 | B2 | 3/2016 | Redaelli |
| 9,673,393 | B2 | 6/2017 | Pellizzer |
| 2004/0195604 | A1 | 10/2004 | Hwang et al. |
| 2005/0001212 | A1 | 1/2005 | Matsui |
| 2005/0243596 | A1 | 11/2005 | Symanczyk |

(Continued)

OTHER PUBLICATIONS

KidsPedia. "Learn english: Cursive Letter—V" (Jun. 12, 2010) Retrieved from https:1lwww.youtube.com/watch?v=MmEclOwdvkQ.

(Continued)

*Primary Examiner* — Matthew Reames
*Assistant Examiner* — Christopher Culbert
(74) *Attorney, Agent, or Firm* — Wells St. John P.S.

(57) ABSTRACT

An array of memory cells includes buried access lines having conductively doped semiconductor material. Pillars extend elevationally outward of and are spaced along the buried access lines. The pillars individually include a memory cell. Outer access lines are elevationally outward of the pillars and the buried access lines. The outer access lines are of higher electrical conductivity than the buried access lines. A plurality of conductive vias is spaced along and electrically couple pairs of individual of the buried and outer access lines. A plurality of the pillars is between immediately adjacent of the vias along the pairs. Electrically conductive metal material is directly against tops of the buried access lines and extends between the pillars along the individual buried access lines. Other embodiments, including method, are disclosed.

25 Claims, 8 Drawing Sheets

(56) References Cited

U.S. PATENT DOCUMENTS

| | | |
|---|---|---|
| 2006/0226409 A1 | 10/2006 | Burr |
| 2007/0272913 A1 | 11/2007 | Scheuerlein |
| 2007/0285969 A1 | 12/2007 | Toda et al. |
| 2009/0230378 A1 | 9/2009 | Ryoo et al. |
| 2010/0171188 A1* | 7/2010 | Lung .................... H01L 21/743 257/413 |
| 2010/0243980 A1 | 9/2010 | Fukumizu |
| 2010/0254175 A1 | 10/2010 | Scheuerlein |
| 2011/0001114 A1* | 1/2011 | Zanderighi ......... H01L 27/2445 257/4 |
| 2011/0155985 A1 | 6/2011 | Oh et al. |
| 2012/0248504 A1 | 10/2012 | Liu |
| 2014/0206171 A1 | 7/2014 | Redaelli |
| 2016/0111639 A1 | 4/2016 | Wells |

OTHER PUBLICATIONS

Microsoft. "Old English Text MT" (2008) Retrieved from https:llweb.archive.org/web/20081101224859/http:llwww.microsoft.com/typography/fonts/family.aspx?FID=127.

* cited by examiner

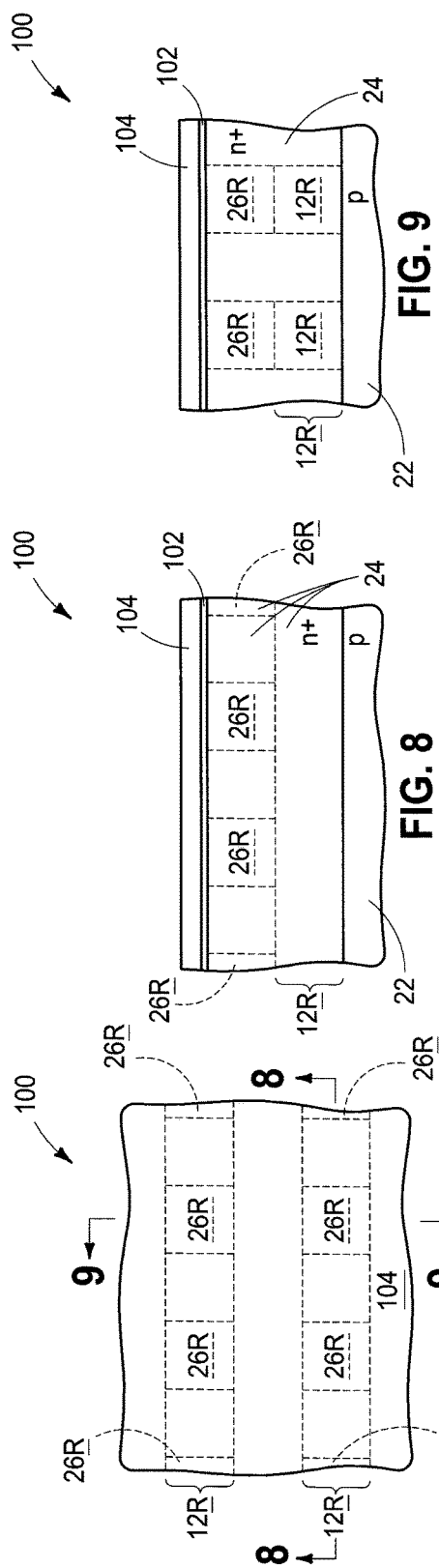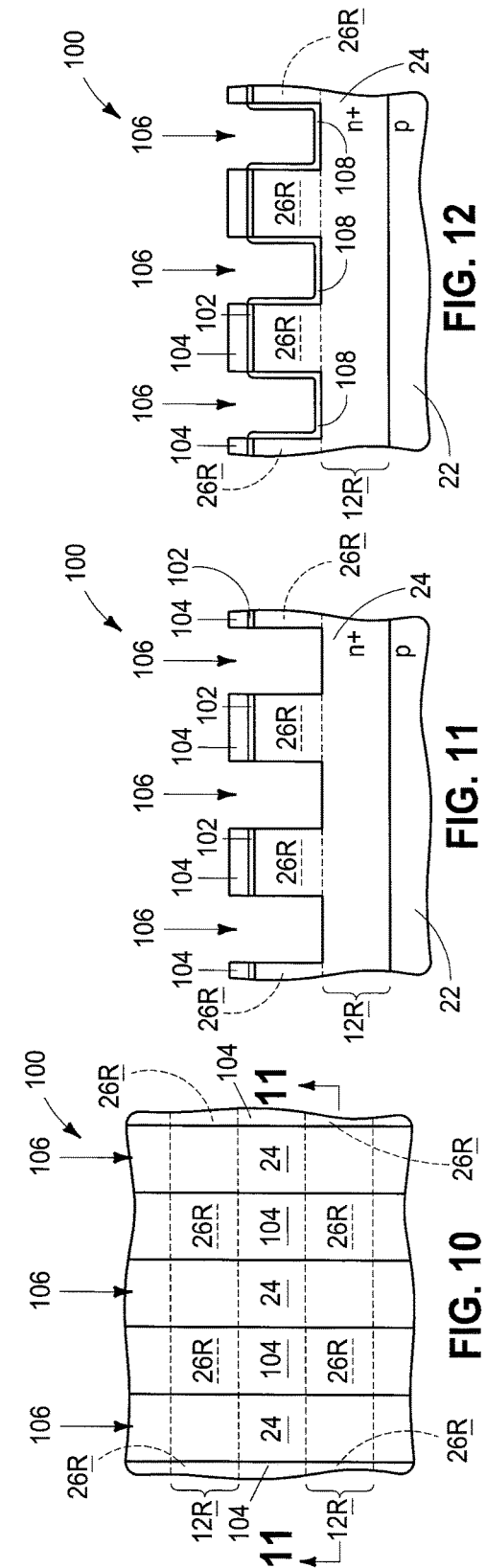

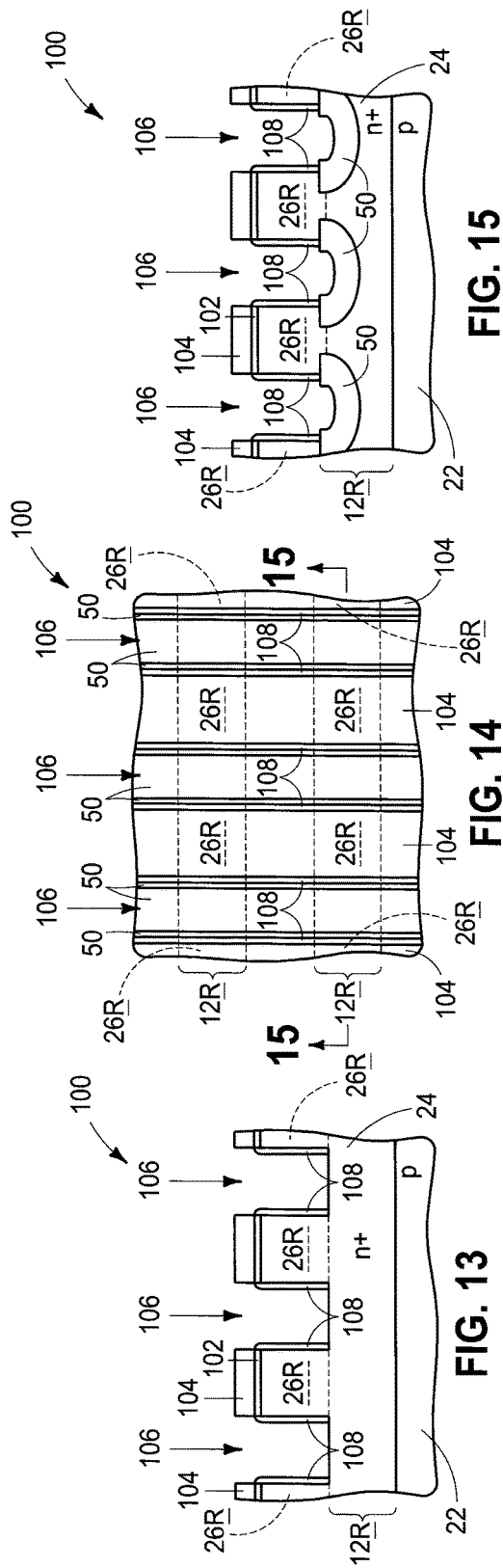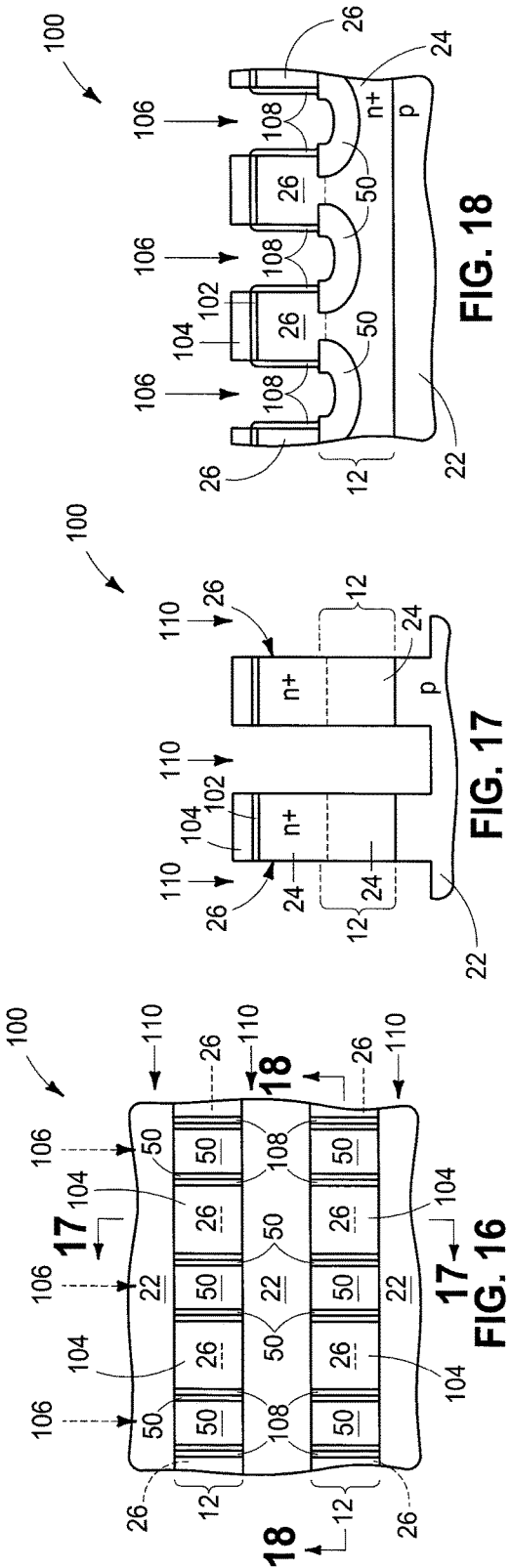

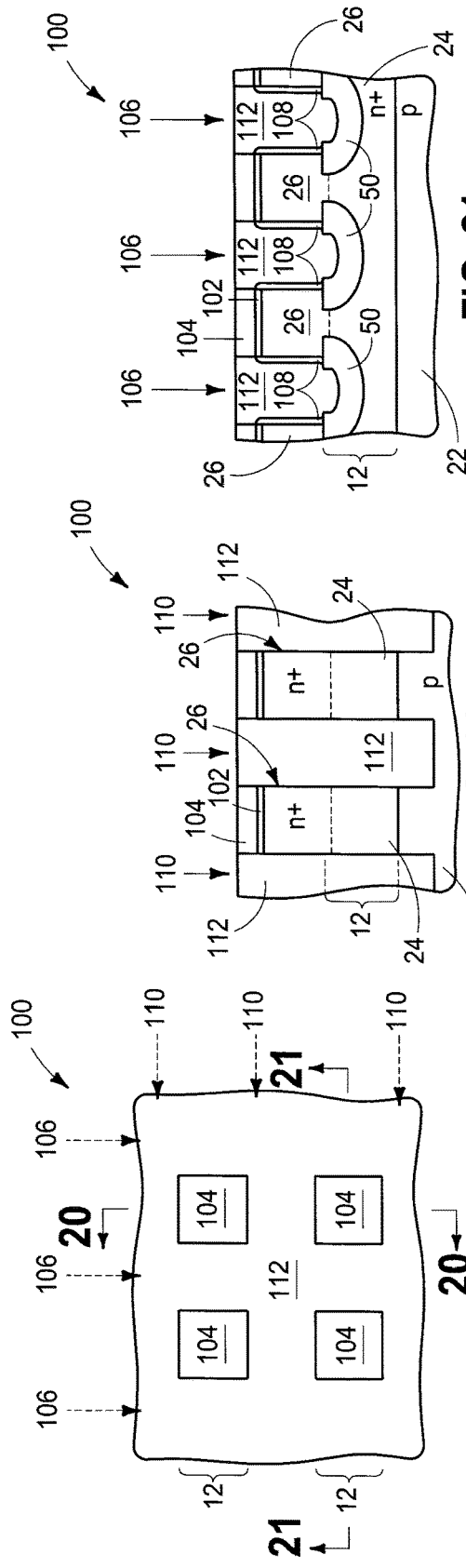

ARRAYS OF MEMORY CELLS AND METHODS OF FORMING AN ARRAY OF MEMORY CELLS

RELATED PATENT DATA

This patent resulted from a divisional application of U.S. patent application Ser. No. 13/761,570, filed Feb. 7, 2013, entitled "Arrays Of Memory Cells And Methods Of Forming An Array Of Memory Cells", naming Jun Liu and Kunal Parekh as inventor, the disclosure of which is incorporated by reference.

TECHNICAL FIELD

Embodiments disclosed herein pertain to arrays of memory cells and to methods of forming an array of memory cells.

BACKGROUND

Memory is one type of integrated circuitry, and may be used in electronic systems for storing data. Memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information. The stored memory may be non-volatile wherein the memory state is maintained for a considerable period of time, and in many instances where power is completely removed from the circuitry. Alternately, the memory may be volatile, requiring to be refreshed (i.e., rewritten), and in many instances multiple times per second.

One type of non-volatile memory is phase change memory. Such memory uses a reversibly programmable material that has the property of switching between two different phases, for example between an amorphous, disorderly phase and a crystalline or polycrystalline orderly phase. The two phases may be associated with resistivities of significantly different values. Presently, typical phase change materials are chalcogenides, although other materials may be developed. With chalcogenides, the resistivity may vary by two or more orders of magnitude when the material passes from the amorphous (more resistive) phase to the crystalline (more conductive) phase, and vice-versa. Phase change can be obtained by locally increasing the temperature of the chalcogenide. Below 150° C., both phases are stable. Starting from an amorphous state and rising to temperature above about 400° C., a rapid nucleation of the crystallites may occur and, if the material is kept at the crystallization temperature for a sufficiently long period of time, it undergoes a phase change to become crystalline. Reversion to the amorphous state can result by raising the temperature above the melting temperature (about 600° C.) followed by rapid cooling.

In phase change memory, a plurality of memory cells is typically arranged in rows and columns to form an array or sub-array. Each memory cell is coupled to a respective select or access device which may be implemented by any switchable device, such as a PN diode, a bipolar junction transistor, a field effect transistor, etc. The access device is often electrically coupled with, or forms a part of, what is referred to as an access line or word line. A resistive electrode is electrically coupled with the switchable device, and comprises heater material which is configured to heat up upon sufficient current flowing there-through. The phase change material is provided in proximity to the heater material, thereby forming a programmable storage element. The crystallization temperature and the melting temperature are obtained by causing an electric current to flow through the heater material, thus heating the phase change material. An electrode, typically referred to as a bit, digit, or select line, is electrically coupled to the phase change material.

Other types of memory may not use phase change material, with perhaps the simplest and smallest form of a memory cell comprising a pair of electrodes having programmable material positioned there-between.

BRIEF DESCRIPTION OF THE DRAWINGS

FIG. 7 is a diagrammatic top plan view of a substrate fragment in process in accordance with an embodiment of the invention.

FIG. 8 is a view of the FIG. 7 substrate taken through line 8-8 in FIG. 7.

FIG. 9 is a view of the FIG. 7 substrate taken through line 9-9 in FIG. 7.

FIG. 10 is a view of the FIG. 7 substrate at a processing step subsequent to that shown by FIG. 7.

FIG. 11 is a view of the FIG. 10 substrate taken through line 11-11 in FIG. 10.

FIG. 12 is a view of the FIG. 11 substrate at a processing step subsequent to that shown by FIG. 11.

FIG. 13 is a view of the FIG. 12 substrate at a processing step subsequent to that shown by FIG. 12.

FIG. 14 is a top view of the FIG. 13 substrate at a processing step subsequent to that shown by FIG. 13.

FIG. 15 is a view of the FIG. 14 substrate taken through line 15-15 in FIG. 14.

FIG. 16 is a view of the FIG. 14 substrate at a processing step subsequent to that shown by FIG. 14.

FIG. 17 is a view of the FIG. 16 substrate taken through line 17-17 in FIG. 16.

FIG. 18 is a view of the FIG. 16 substrate taken through line 18-18 in FIG. 16.

FIG. 19 is a view of the FIG. 16 substrate at a processing step subsequent to that shown by FIG. 16.

FIG. 20 is a view of the FIG. 19 substrate taken through line 20-20 in FIG. 19.

FIG. 21 is a view of the FIG. 19 substrate taken through line 21-21 in FIG. 19.

FIG. 22 is a diagrammatic top plan view of a substrate fragment in process in accordance with an embodiment of the invention.

FIG. 23 is a view of the FIG. 22 substrate taken through line 23-23 in FIG. 22.

FIG. 24 is a view of the FIG. 22 substrate taken through line 24-24 in FIG. 22.

DETAILED DESCRIPTION OF EXAMPLE EMBODIMENTS

Figure 1:
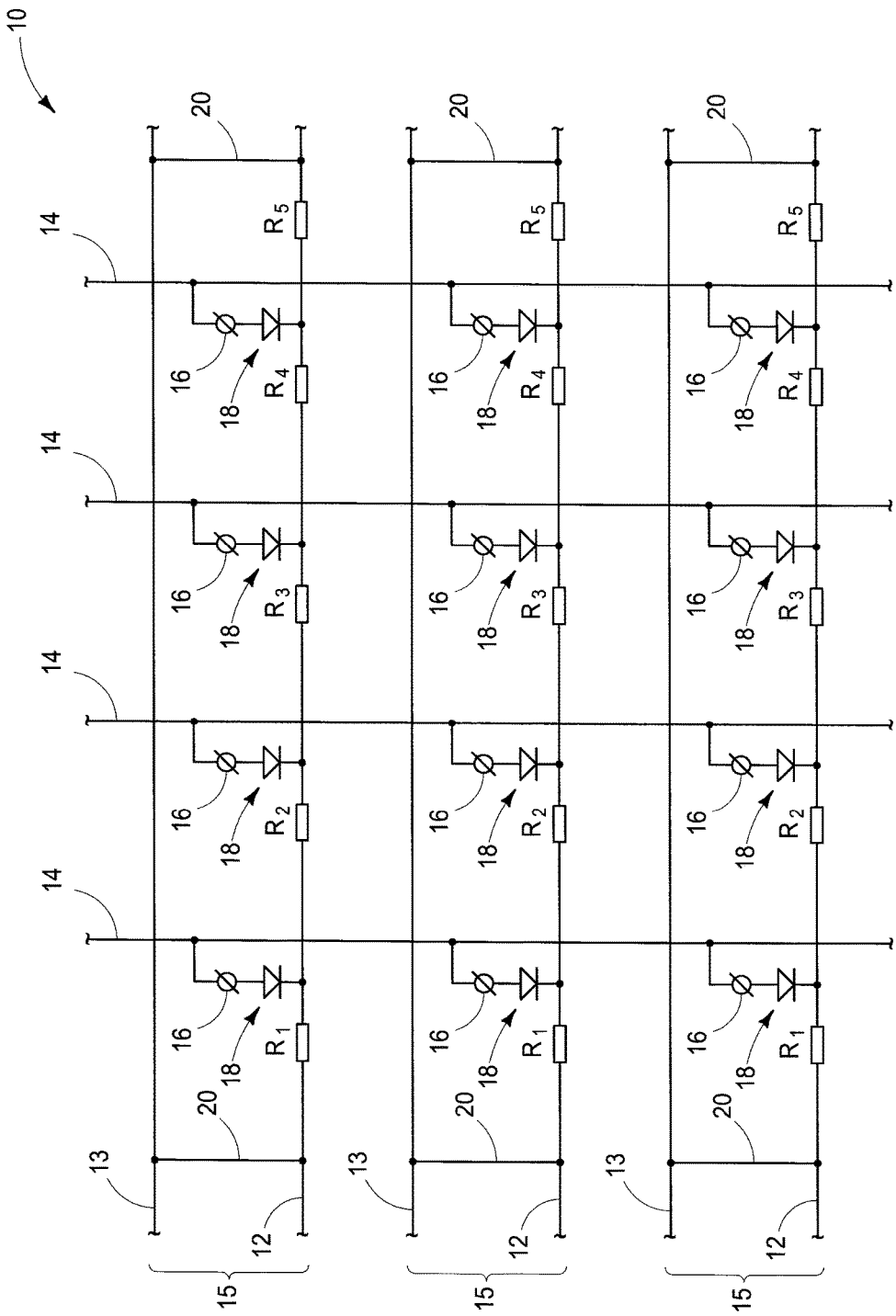
FIG. 1 is a schematic of an array of memory cells in accordance with an embodiment of the invention.

FIG. 1 is a schematic representation of a predecessor array or sub-array of memory cells and of an example array or sub-array of memory cells in accordance with some embodiments of the invention. As used in this document, a "sub-array" may also be considered as an array. The FIG. 1 memory array 10 comprises access lines 12 (e.g., word lines), sense lines 14 (e.g., bit lines), and individual memory cells 16 associated with intersections of the access and sense lines. Memory cells 16 are fabricated relative to pillars which extend elevationally outward of and are spaced along buried access lines 12, for example as will be described below. Access lines 12 are buried relative to a semiconductor substrate and comprise conductively-doped semiconductor material (e.g., monocrystalline silicon doped n+, with "n" being an example first conductivity type). In some embodiments, a select device 18 (e.g., a diode) is between individual memory cells 16 and access lines 12.

Conductively-doped semiconductor material is typically not as electrically conductive as metal material. In the context of this document, "metal material" defines any one or combination of elemental metal(s), an alloy of two or more elemental metals, and electrically conductive metal compounds. In light of this lower conductivity, access lines 13 are provided in circuit-parallel with and elevationally outward of buried access lines 12, thereby forming pairs 15 of individual buried access lines 12 and outer access lines 13. A plurality of conductive vias 20 is provided along and electrically couple pairs of the individual buried and outer access lines. A plurality of memory cells 16 is between immediately adjacent vias 20 along pairs 15. The higher conductive lines 13 through vias 20 provide greater conductivity along the individual access line pairs 15 than would occur using conductively doped semiconductor access lines 12 alone.

FIG. 1 shows four individual memory cells 16 between each of immediately adjacent conductive vias 20, although fewer or ideally many more memory cells may be between immediately adjacent vias. Regardless, individual memory cells 16 between conductive vias 20 may experience different resistances relative to access line pairs 15 due to different respective distances from conductive vias 20. For example, consider $R_2$, $R_3$, and $R_4$ as resistances along a buried access line 12 between immediately adjacent memory cells, and $R_1$ and $R_5$ as resistances between the end memory cells and the immediately adjacent via 20. The far-left-illustrated memory cell experiences resistance $R_1$ in parallel with $R_2+R_3+R_4+R_5$ while the one to the immediate right experiences $R_1+R_2$ in parallel with $R_3+R_4+R_5$. Reducing resistance relative to those memory cells which are furthest from a conductive via may improve performance of the memory array. Additionally or alternately, reducing such resistance may enable more memory cells to be provided between the conductive vias, thereby reducing the number of conductive vias and increasing circuit density.

An example structure embodiment of an array of memory cells in accordance with the invention and the FIG. 1 schematic is next described with reference to a construction 9 shown in FIGS. 2-4. Like numerals from the FIG. 1 schematic have been used where appropriate. Solid dielectric material would likely surround and be in void space in FIGS. 2-4, and is not shown for clarity in viewing operative circuit components. Symbols are used in the various figures to indicate dopant levels in semiconductor material. Specifically, some or all of the designations p+, p, p−, n−, n, and n+ may be used to indicate conductivity type and levels of doping. Also, the difference in dopant concentration between or among regions identified with a "+", a "−", or without a "+" or "−" may vary depending on the particular material that is doped. Regardless, "+" indicates greater dopant concentration than no symbol after "p" or "n", and no symbol after "p" or "n" indicates greater doping than "−". An example dopant concentration of a "+" region in monocrystalline silicon is at least about $10^{19}$ atoms/cm$^3$ (and in some examples applications may be from about $10^{19}$ atoms/cm$^3$ to about $10^{20}$ atoms/cm$^3$). An example dopant concentration not expressed with a "+" or "−" is from about $10^{18}$ to about $10^{19}$ atoms/cm$^3$. An example dopant concentration of a "−" region is less than about $5\times10^{18}$ atoms/cm$^3$. The terms "p" and "n" are used herein to refer to both dopant type (i.e., a first or second type) and relative dopant concentrations unless hyphenated to the word "type". Accordingly, for purposes of interpreting this disclosure and the claims which follow, it is to be understood that the term "p-type doped" and "n-type doped" refer to dopant type of regions and not to relative dopant levels. Further, reference to first conductivity type and second conductivity type refer to different conductivity types either of which may be p-type or n-type independent of dopant level/concentration.

Figure 2:
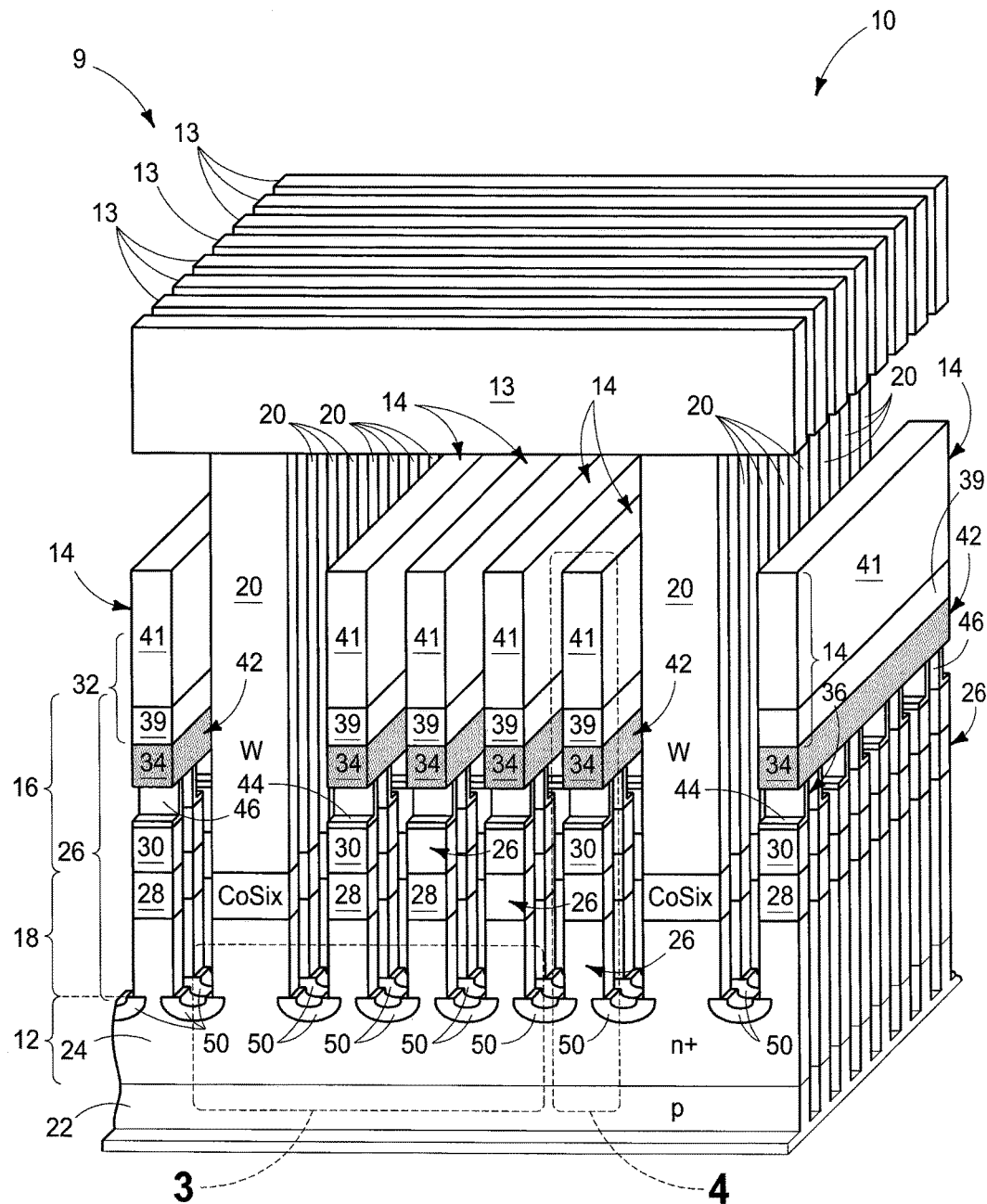
FIG. 2 is a diagrammatic oblique view of a construction of an array of memory cells in accordance with an embodiment of the invention.
Figure 3:
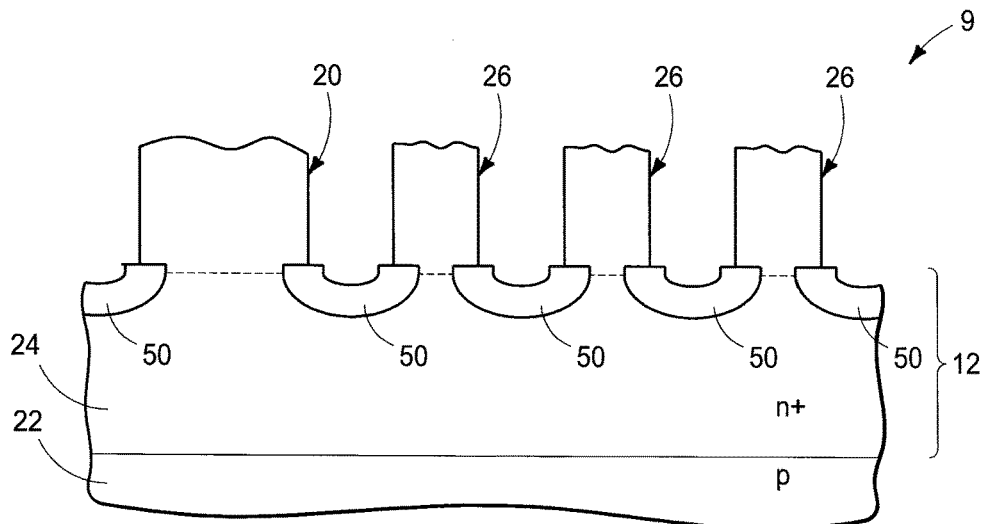
FIG. 3 is an enlarged front view of area 3 in FIG. 1.
Figure 4:
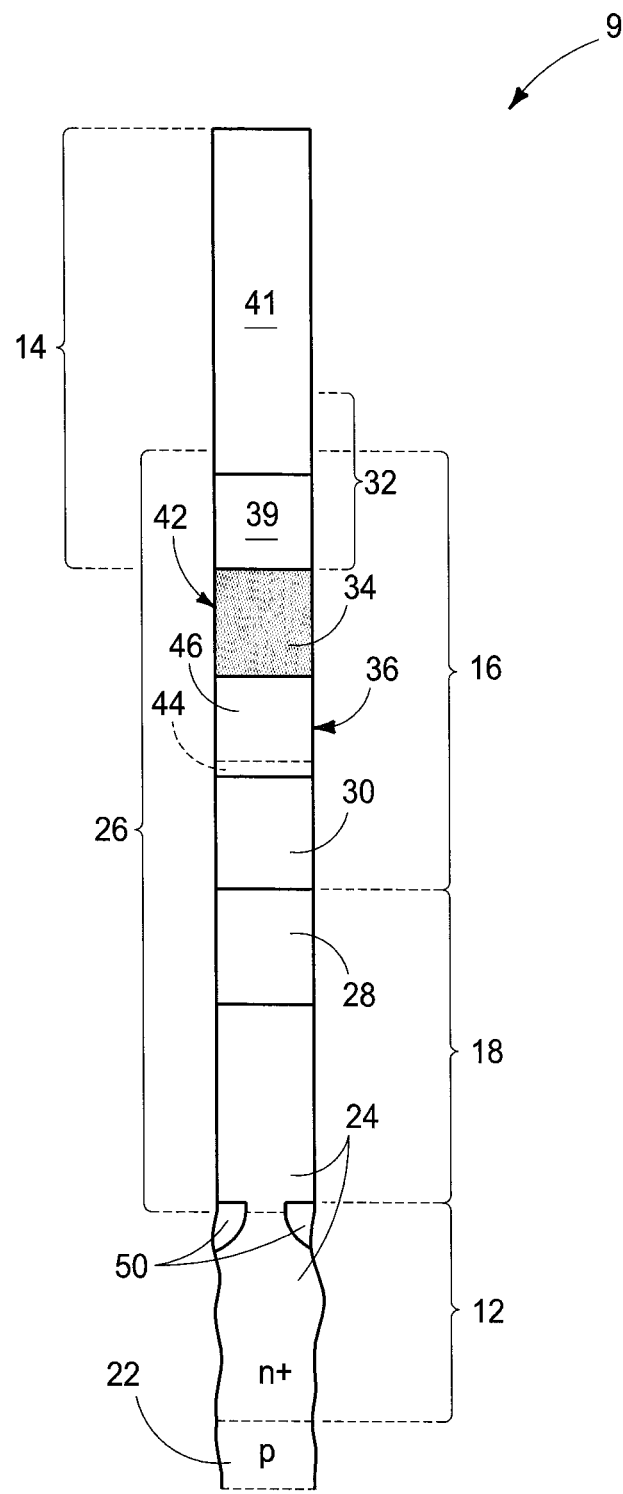
FIG. 4 is an enlarged front view of area 4 in FIG. 1.

The FIGS. 2-4 construction comprises buried access lines 12 comprising conductively-doped semiconductor material 24, for example doped with a first conductivity type shown as n+. Any of the materials, regions, and/or structures described herein may be homogenous or non-homogenous. Further, each may be formed using any suitable existing or yet-to-be developed technique (with or without plasma), with atomic layer deposition, chemical vapor deposition, physical vapor deposition, epitaxial growth, diffusion doping, and ion implanting being examples. In the depicted example, second conductivity type semiconductor material 22 is elevationally inward of conductively-doped first type semiconductor material 24, and is shown as p. Semiconductor material 22 may be comprised by a semiconductor base, such as, for example, a monocrystalline silicon wafer and/or a semiconductor-on-insulator substrate. The semiconductor base may be referred to or considered as a semiconductor substrate, or as a portion of a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In some embodiments, the p-type doped region 22 may be a collector region of a bipolar transistor. In some embodiments, region 22 may be part of a semiconductor base containing one or more structures associated with integrated circuit fabrication. For instance, the base may comprise CMOS and/or other logic circuitry. Such logic circuitry may be configured for controlling some aspect of current flow during programming and/or reading of memory cells of memory array 10.

Pillars 26 extend elevationally outward of and are spaced along buried access lines 12. Pillars individually comprise individual memory cells 16, and in one embodiment a select device 18 between a buried access line 12 and a memory cell 16. In the depicted example, select devices 18 are in the form of a diode comprising an extension of n+ material 24 and an overlying p+ semiconductor material region 28. An uppermost portion of material 24 may be n (i.e., between "+" and "−" dopant concentration) and an innermost portion of region 28 may be p (i.e., between "+" and "−" dopant concentration). Alternate select devices and constructions, including constructions that may not include select devices, may be used. Example memory cells 16 are shown as individually comprising a pair of electrodes 30 and 32 having phase change material 34 and heater material 36 there-between. By way of examples only, example phase change material 34 includes chalcogenides, such as GeSbTe-based materials. Example heater material 36 includes TiSiN-based materials and TiN-based materials having material other than silicon therein. Electrodes 30 and 32 comprise any suitable conductive material, for example conductively doped semiconductive material and/or metal material (e.g., elemental tungsten and/or refractory metal silicides such as cobalt silicide).

In one embodiment, the pair of electrodes comprises an elevationally outer electrode 32 and an elevationally inner electrode 30. Elevationally outer electrode 32 comprises a sense line 14 that electrically couples pillars 26 that extend from different individual buried access lines 12. Sense lines 14 comprise any suitable conductive material, for example conductively doped semiconductive material and/or metal material (e.g., elemental copper 41 over elemental tungsten 39). In one embodiment and as shown, phase change material 34 is arrayed in individual lines 42 that are elevationally inward of and extend along individual select lines 14. Alternately, such may be separated (not shown) as part of isolated pillars 26. In one embodiment, heater material 36 comprises an angled plate structure having a first portion 44 and a second portion 46 that extends elevationally outward from first portion 44. Such may be formed, by way of example, by depositing heater material over a sidewall and base (e.g., bottom) of respective openings in dielectric or other material. The heater material could then be patterned using photolithographic masking to form the heater material constructions 36 shown in FIGS. 2 and 4. Alternately, the heater material may be patterned using a maskless anisotropic spacer etch process whereby it is removed from being over horizontal surfaces but for at least some of the horizontal surfaces of inner electrodes 30 (and with or without prior deposition of an additional spacer layer before the etch). Any alternate memory cell construction may be used, for example any having a pair of electrodes with programmable material there-between in the absence of phase change and/or heater materials.

Outer access lines 13 (FIG. 2) are elevationally outward of pillars 26 and buried access lines 12. Outer access lines 13 are of higher electrical conductivity then buried access lines 12. Example outer access line materials are metal materials, with elemental copper being a specific example. Any suitable elevational thickness may be used for the various materials, with examples for that part of material 24 that is within inner access line outlines 12 being about 1,000 Angstroms and that for outer access lines 13 being about 2,000 Angstroms.

A plurality of conductive vias 20 is spaced along and electrically couple pairs 15 (FIG. 1) of individual of buried access lines 12 and individual outer access lines 13. A plurality of pillars 26 is between immediately adjacent vias 20 along the pairs, for example four pillars 26 as shown in FIGS. 1 and 2. Again, ideally many more pillars than four, for example tens, hundreds, etc., may be between immediately adjacent of the vias along the access line pairs. The conductive vias may comprise any electrically conductive material, ideally metal material, and with example vias 20 shown as being a composite of cobalt silicide and tungsten.

Electrically conductive metal material 50 is directly against tops of buried access lines 12 and extends between pillars 26 along individual buried access lines 12. Accordingly, metal material 50 comprises part of individual buried access lines 12. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Metal material 50 is of higher electrical conductivity than conductively-doped semiconductor material 24. In one embodiment, electrical contact resistance between metal material 50 and conductively-doped semiconductor material 24 (i.e., going through the interface of materials 24 and 50) is less than half of the intrinsic electrical resistance of conductively-doped semiconductor material 24.

In one embodiment, that portion of metal material 50 that is directly against the tops of buried access lines 12 is a metal silicide (e.g., cobalt silicide and/or titanium silicide, etc.), and in one embodiment where that portion of buried access lines 12 which the metal silicide is directly against (i.e., at least the tops) comprises elemental silicon. In one embodiment, metal material 50 consist essentially of metal silicide. In one embodiment, metal material 50 comprises metal other than metal silicide (i.e., elemental, alloy, and/or metal compound) which is directly against a metal silicide. In one embodiment, that portion of metal material 50 that is directly against the tops of buried access lines 12 is not a metal silicide (e.g., elemental tungsten, titanium, and/or titanium nitride). In one embodiment, metal material 50 is devoid of metal silicide. In one embodiment where a portion of metal material 50 that is directly against buried access line 12 is other than a metal silicide, such portion is at least one of an elemental metal, an alloy of elemental metals, or another metal compound consisting of elements other than that of the conductively-doped semiconductor material. In one specific example, the metal material may comprise titanium silicide directly against tops of material 24, with titanium nitride being directly against and atop the titanium silicide and elemental tungsten directly against and atop the titanium nitride.

Figure 5:
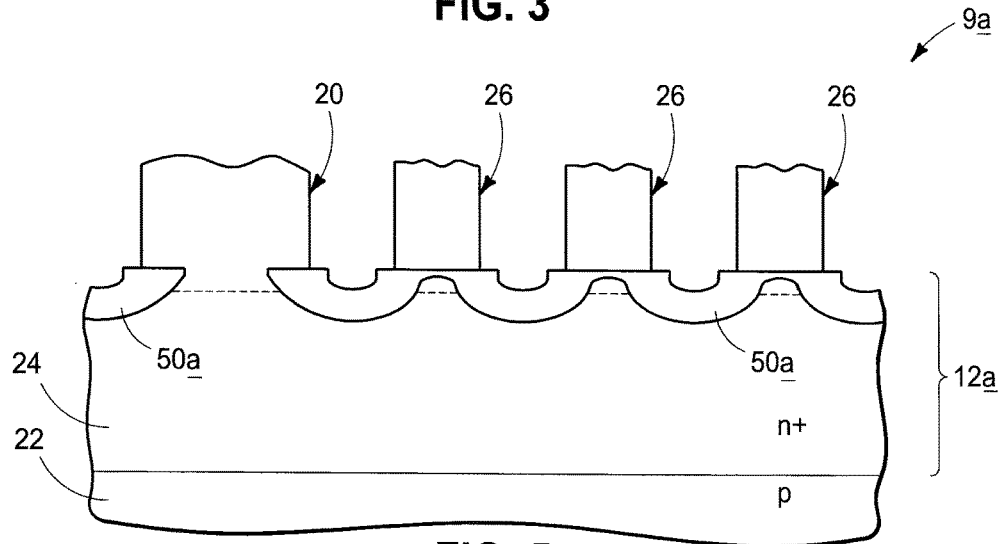
FIG. 5 is an alternate embodiment construction to that of FIG. 3.

Metal material that is directly against the buried access line tops may or may not extend to elevationally under the pillars. FIGS. 2-4 depict an example embodiment wherein metal material 50 does extend to elevationally under pillars 26, but does not interconnect with itself there-under. FIG. 5 depicts an alternate embodiment substrate construction 9a. Like numerals from the above described embodiment have been used where appropriate, with some construction differences being indicated with suffix "a". In construction 9a, metal material 50a does interconnect with itself under pillars 26.

Figure 6:
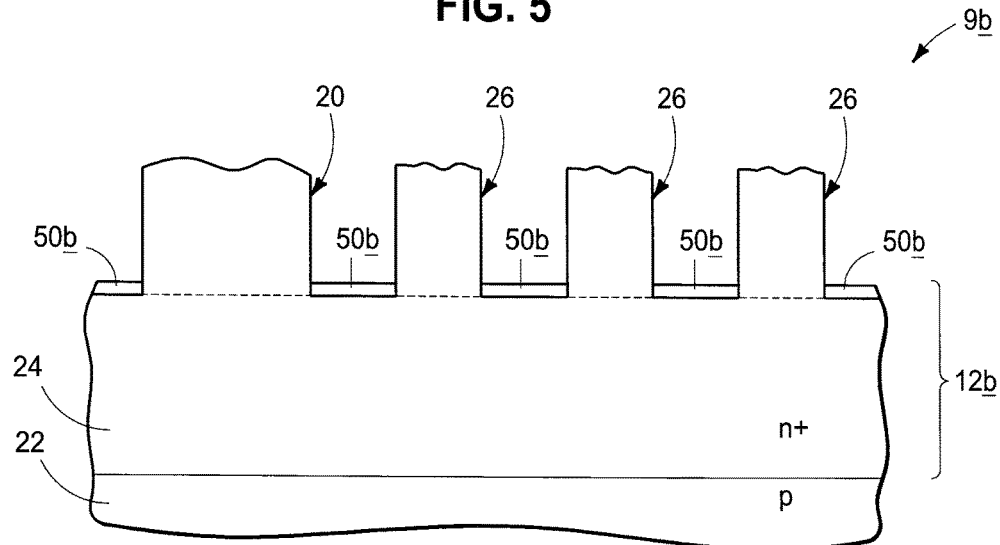
FIG. 6 is an alternate embodiment construction to that of FIGS. 3 and 5.

FIG. 6 illustrates yet another alternate construction 9b. Like numerals from the above described embodiment have been used where appropriate, with some construction differences being indicated with suffix "b". In construction 9b, metal material 50b does not extend to under any portion of pillars 26.

Provision of higher electrically conductive metal material 50 between pillars 26, even if such does not interconnect with itself there-under or there-around, may reduce electrical resistance of buried access lines 12 thereby improving memory array operation and/or enabling more pillars of memory cells to be provided between immediately adjacent conductive vias 20.

Embodiments of the invention encompass methods of forming an array of memory cells, with an example such embodiment being next described with reference to FIGS. 7-21. Referring to FIGS. 7-9, a predecessor substrate construction 100 is shown that may be used in fabricating any of the embodiments of FIGS. 1-6. Like numerals from the above embodiments have been used where appropriate. In one embodiment, construction 100 comprises semiconductor material 22 and 24 which have been appropriately doped, implanted, and/or otherwise processed to provide desired dopant type and concentration. Masking material has been provided over conductively-doped semiconductor material 24, with two materials 102 (e.g., pad oxide) and 104 (e.g., silicon nitride) being shown. Pillar regions 26R and buried access line regions 12R are shown where pillars 26 and buried access lines 12 will ultimately be formed.

Referring to FIGS. 10 and 11, shallow trenches 106 have been formed into conductively-doped semiconductor material 24. In this document, reference to trenches as being "deep" (as used below) or "shallow" is only in degree of elevational depth relative one another. The trenches formed herein may be formed using photolithographic patterning and subsequent anisotropic etch, and/or in other manners. In one embodiment, material 24 comprises silicon which has been conductively-doped with conductivity enhancing dopant of a first conductivity type.

Referring to FIG. 12, sidewalls and bases (i.e., bottoms) of shallow trenches 106 have been lined with dielectric 108. An example material 108 comprises silicon dioxide formed by oxidation of semiconductor material 24. Dielectric material 108 may be of the same composition of either masking material 102 or 104 where at least one of such is dielectric, or may be of different composition from materials 102 and 104. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous.

Referring to FIG. 13, dielectric 108 has been removed from the bases of shallow trenches 106 (e.g., but for dielectric 108 thereover which still lines sidewalls of shallow trenches 106). Such may be conducted by suitable anisotropic etching of material 108 to remove such from horizontal surfaces.

Referring to FIGS. 14 and 15, conductive metal material 50 has been formed against the bases of shallow trenches 106 to extend between pillar regions 26R atop buried access lines 12R. Metal material 50 may be formed to extend at least partially beneath pillar regions 26R, for example as shown. FIGS. 14 and 15 depict fabrication that may be conducted in ultimately producing the depicted FIGS. 2-4 embodiment referred to above. Accordingly, metal material 50 is only partially received under the pillar regions 26R and does not connect with itself there-beneath. Alternately as examples, such might be processed to interconnect with itself beneath pillar the regions, or formed to not extend beneath any portion of the pillar regions. One example manner of forming conductive metal material 50 is by reacting metal (i.e., elemental, alloy, and/or compound forms) with silicon of bases of shallow trenches 106 to form conductive metal silicide over such bases. Metal that is unreacted to form silicide could be dry or wet etched selectively relative to the silicide thereafter. Formation of such metal silicide might occur during deposition of metal blanketedly over substrate construction 100 and/or by conducting of a subsequent anneal to cause such reacting. Regardless, an example metal silicide 50 might be formed thereby in a self-aligned manner (i.e., with at least one pair of opposing edges of such material being formed by a pair of previously-defined edges, thereby not requiring subsequent photolithographic processing with respect to those edges).

In one embodiment and as shown, the reacting forms conductive metal silicide 50 elevationally under dielectric sidewall lining 108. In one embodiment, the reacting forms conductive metal silicide 50 laterally into and elevationally under pillar regions 26R, and thereby ultimately with respect to the pillars that will be formed. In one embodiment, the reacting extends conductive metal silicide elevationally under the pillars, and in one embodiment wherein the reacting interconnects the conductive metal silicide elevationally under the pillar regions (FIG. 5) and in one embodiment wherein the reacting does not interconnect the conductive metal silicide elevationally under the pillars (FIGS. 2-4 and FIG. 15). Other conductive material may be provided over and electrically coupled with a metal silicide 50. Alternately, conductive material 50 might be formed without reacting with underlying material 24 and/or without forming a metal silicide, and for example forming a construction like that of FIG. 6.

Referring to FIGS. 16-18, deep trenches 110 have been formed through conductive metal silicide 50, through conductively doped first type semiconductor material 24, and into second conductivity type semiconductor material 22 to form buried access lines 12 running along and between deep trenches 110. The act of forming deep trenches 110 also forms pillars 26 which comprise first type semiconductor material 24 that extends elevationally outward of and are spaced along buried access lines 12.

Referring to FIGS. 19-21, dielectric material 112 has been formed within shallow trenches 106 and deep trenches 110. Any suitable composition may be used, with silicon dioxide being an example. As alternate example processing, dielectric material 112 filling the shallow trenches 106 may be deposited at the conclusion of the FIGS. 14 and 15 processing. Still alternately, some or all of dielectric material 112 could be provided subsequently. Regardless, FIGS. 19-21 show dielectric material 112 as having been planarized back to the outer surface of material 104.

Subsequent processing would occur to produce constructions as identified above in conventional or other manners not particularly germane to method embodiments of the disclosure. Such methods would include forming the outer access lines elevationally outward of the pillars. The plurality of conductive vias spaced along and electrically coupling pairs of individual of the buried and outer access lines would be provided, albeit likely before or commensurate with forming the outer access lines. A plurality of the pillars will be spaced between immediately adjacent of those vias along the line pairs. Memory cells are ultimately provided within individual of the pillars.

The above processing shown and described with reference to FIGS. 7-21 formed shallow trenches 106 before forming deep trenches 110. Alternate example processing is described next with respect to a construction 100a shown in FIGS. 22-27 wherein the deep trenches are formed first. Like numerals from that of the FIGS. 7-21 embodiment are used where appropriate, with some construction differences being indicated with suffix "a".

Referring to FIGS. 22-24, such correspond in processing sequence to FIGS. 10 and 11 of the FIGS. 7-21 embodiment. Deep trenches 110 have been formed through conductively-doped semiconductor material 24 and into second conductivity type semiconductor material 22 that is inwardly thereof. Such forms buried access lines 12 comprising conductively-doped semiconductor material 24 running along and between deep trenches 110.

Figure 25:
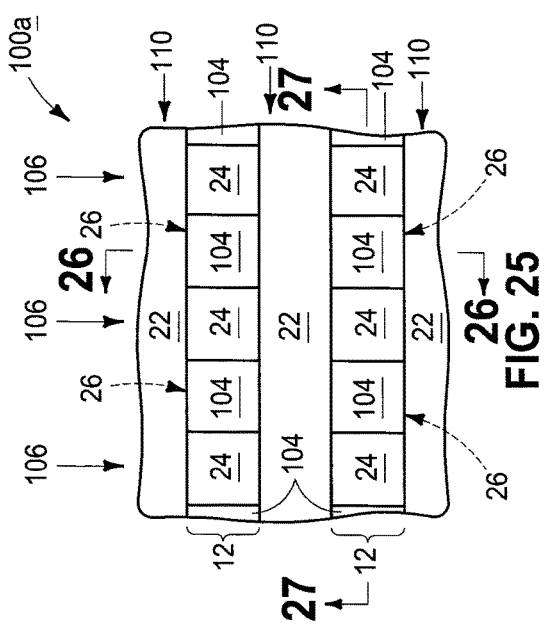
FIG. 25 is a view of the FIG. 22 substrate at a processing step subsequent to that shown by FIG. 22.
Figure 26:
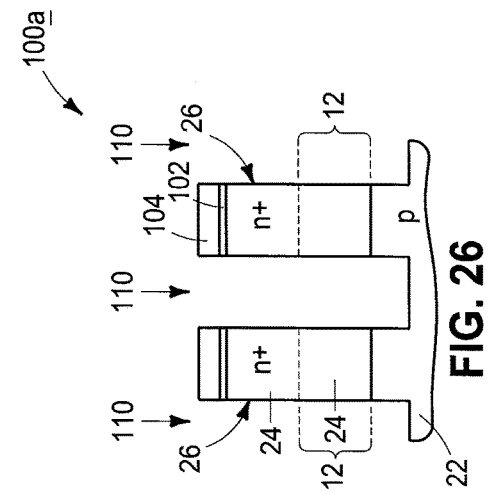
FIG. 26 is a view of the FIG. 25 substrate taken through line 26-26 in FIG. 25.
Figure 27:
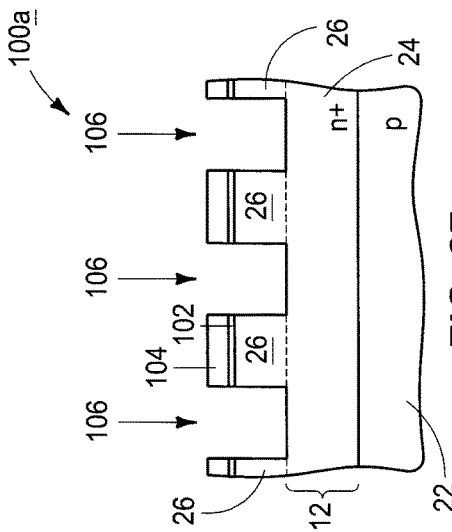
FIG. 27 is a view of the FIG. 25 substrate taken through line 27-27 in FIG. 25.

Referring to FIGS. 25-27 shallow trenches 106 have been formed into conductively-doped semiconductor material 24. The act of forming such shallow trenches forms pillars 26 which comprise conductively-doped semiconductor material 24 extending elevationally outward of and spaced along buried access lines 12.

Processing may occur subsequently analogously to that described above with the FIGS. 7-21 embodiment, whereby outer access lines, conductive vias, and memory cells are provided. Masking (not shown) may be provided to cover over material 22 during the formation of the electrically conductive metal material atop the buried access lines. Alternately, such may be formed over material 22 and subsequently removed while masking over the buried access lines. Still alternately, such may be formed over material 22 and remain in the finished circuitry construction.

Embodiments of the invention encompass a method of forming an array of memory cells comprising forming intersecting shallow trenches and deep trenches into semiconductor material about individual pillar regions of the semiconductor material. Those portions of the semiconductor material beneath and between the pillar regions and between the deep trenches comprise individual buried access line regions. The shallow and deep trenches may be formed at the same time or at different times. The above embodiments described and shown with respect to FIGS. 7-27 form the shallow and deep trenches at different times. FIGS. 7-21 show forming the shallow trenches before forming the deep trenches, and FIGS. 22-27 show forming the deep trenches before forming the shallow trenches.

Regardless, conductive metal material is ultimately formed against bases of the shallow trenches to extend between the pillar regions atop the buried access line regions. Outer access lines are formed elevationally outward of the pillar regions. A plurality of conductive vias spaced along and electrically coupling pairs of individual of the buried access line regions and the outer lines are ultimately provided. A plurality of the pillar regions is spaced between immediately adjacent vias along the pairs of outer and buried access lines. A memory cell is ultimately provided within individual of the pillar regions.

The semiconductor material of the buried access line regions is ultimately provided to be conductively-doped. The above described processing with respect to FIGS. 7-27 are but examples where such occurs prior to formation of either of the shallow and deep trenches. However, the buried access line regions, and other regions, may be conductively-doped (e.g., by ion implanting) after formation of one or both of the shallow and deep trenches. Regardless, the outer access lines are more electrically conductive than the conductively-doped buried access line regions in a finished circuitry construction.

CONCLUSION

In some embodiments, an array of memory cells comprises buried access lines comprising conductively doped semiconductor material. Pillars extend elevationally outward of and are spaced along the buried access lines. The pillars individually comprise a memory cell. Outer access lines are elevationally outward of the pillars and the buried access lines. The outer access lines are of higher electrical conductivity than the buried access lines. A plurality of conductive vias is spaced along and electrically couple pairs of individual of the buried and outer access lines. A plurality of the pillars is between immediately adjacent of the vias along the pairs. Electrically conductive metal material is directly against tops of the buried access lines and extends between the pillars along the individual buried access lines.

In some embodiments, a method of forming an array of memory cells comprises forming intersecting shallow trenches and deep trenches into semiconductor material about individual pillar regions of the semiconductor material. Those portions of the semiconductor material beneath and between the pillar regions and between the deep trenches comprise individual buried access line regions. Conductive metal material is formed against bases of the shallow trenches to extend between the pillar regions atop the buried access line regions. Outer access lines are formed elevationally outward of the pillar regions. A plurality of conductive vias is spaced along and electrically couple pairs of individual of the buried access line regions and the outer access lines. A plurality of the pillar regions is spaced between immediately adjacent of the vias along the pairs. A memory cell is provided within individual of the pillar regions. The semiconductor material of the buried access line regions is provided to be conductively doped. The outer access lines are more electrically conductive than the conductively doped buried access line regions in a finished circuitry construction.

In some embodiments, a method of forming an array of memory cells comprises forming shallow trenches into conductively doped silicon-comprising semiconductor material of a first conductivity type. Second conductivity type semiconductor material is elevationally inward of the conductively doped first type semiconductor material. Metal is reacted with silicon of bases of the shallow trenches to form conductive metal silicide over the bases. Deep trenches are formed through the conductive metal silicide, through the conductively doped first type semiconductor material, and into the second conductivity type semiconductor material to form buried access lines running along and between the deep trenches. The forming of the deep trenches forms pillars comprising conductively doped first type semiconductor material extending elevationally outward of and spaced along the buried access lines. Outer access lines are formed elevationally outward of the pillars. A plurality of conductive vias spaced along and electrically coupling pairs of individual of the buried and outer access lines is provided. A plurality of the pillars is spaced between immediately adjacent of the vias along the pairs. A memory cell is provided within individual of the pillars.

In some embodiments, a method of forming an array of memory cells comprises forming deep trenches through conductively doped silicon-comprising semiconductor material of a first conductivity type and into second conductivity type semiconductor material that is elevationally inward of the conductively doped first type semiconductor material. The deep trenches form buried access lines comprising conductively doped first type semiconductor material running along and between the deep trenches. Shallow trenches are formed into the first type conductively doped semiconductor material. The forming of the shallow trenches forms pillars comprising conductively doped first type semiconductor material extending elevationally outward of and spaced along the buried access lines. Metal is reacted with silicon of bases of the shallow trenches to form conductive metal silicide over the bases and which extends between the pillars atop the buried access lines. Outer access lines are formed elevationally outward of the pillars. A plurality of conductive vias spaced along and electrically couple pairs of individual of the buried and outer access lines is provided. A plurality of the pillars is spaced between immediately adjacent of the vias along the pairs. A memory cell is provided within individual of the pillars.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of memory cells, comprising:
    buried access lines comprising conductively doped semiconductor material;
    pillars extending elevationally outward of and spaced along the buried access lines, the pillars individually comprising a memory cell;
    outer access lines elevationally outward of the pillars and the buried access lines, the outer access lines being of higher electrical conductivity than the buried access lines;
    a plurality of conductive vias spaced along and electrically coupling pairs of individual of the buried and outer access lines, a plurality of the pillars being between immediately adjacent of the vias along the pairs; and
    electrically conductive metal material directly against tops of the buried access lines and extending between the pillars along the individual buried access lines, the conductive metal material having a concave arcuate elevationally outer surface that is between immediately adjacent of the conductive pillars between the immediately adjacent vias.

2. The array of claim 1 wherein the individual pillars comprise a select device between its buried access line and its memory cell.

3. The array of claim 1 wherein the memory cells individually comprise a pair of electrodes having phase change material there-between.

4. The array of claim 3 wherein the memory cells individually comprise heater material between the pair of electrodes, the heater material comprising an angled plate structure having a first portion and a second portion that extends elevationally outward from the first portion.

5. The array of claim 3 wherein the pair of electrodes comprises elevationally outer and inner electrodes, the elevationally outer electrode comprising a sense line that electrically couples pillars extending from different individual buried access lines.

6. The array of claim 5 wherein the phase change material is in individual lines that are elevationally inward of and extend along individual of the select lines.

7. The array of claim 1 where electrical contact resistance between the metal material and the conductively doped semiconductor material is less than half of intrinsic electrical resistance of the conductively doped semiconductor material.

8. The array of claim 1 wherein that portion of the metal material that is directly against the buried access line tops is a metal silicide.

9. The array of claim 8 wherein that portion of the conductively doped buried access lines which the metal silicide is directly against comprises elemental silicon.

10. The array of claim 8 wherein the metal material consists essentially of the metal silicide.

11. The array of claim 8 wherein the metal material is not homogenous and comprises metal other than the metal silicide that is directly against the metal silicide.

12. The array of claim 1 wherein that portion of the metal material that is directly against the buried access line tops is not a metal silicide.

13. The array of claim 12 wherein said portion is at least one of a metal compound consisting of elements other than that of the conductively doped semiconductor material, an elemental metal, and an alloy of elemental metals.

14. The array of claim 12 wherein the metal material is devoid of metal silicide.

15. The array of claim 1 wherein the metal material extends to elevationally under the pillars.

16. The array of claim 15 wherein the metal material interconnects with itself under the pillars.

17. The array of claim 15 wherein the metal material does not interconnect with itself under the pillars.

18. The array of claim 1 wherein the metal material does not extend to under the pillars.

19. An array of memory cells, comprising:
    buried access lines comprising conductively doped semiconductor material;
    pillars extending elevationally outward of and spaced along the buried access lines, the pillars individually comprising a memory cell;
    outer access lines elevationally outward of the pillars and the buried access lines, the outer access lines being of higher electrical conductivity than the buried access lines;
    a plurality of conductive vias spaced along and electrically coupling pairs of individual of the buried and outer access lines, a plurality of the pillars being between immediately adjacent of the vias along the pairs; and
    electrically conductive metal material directly against tops of the buried access lines and extending between the pillars along the individual buried access lines, that portion of the metal material that is directly against the buried access line tops being a metal silicide, the metal silicide extending to elevationally under the pillars, the metal silicide having a concave arcuate elevationally outer surface that is between immediately adjacent of the conductive pillars between the immediately adjacent vias.

20. The array of claim 1 comprising a dielectric liner against sidewalls of the pillars, the conductive metal material being directly under the dielectric liner, the concave arcuate elevationally outer surface not being directly beneath the dielectric liner.

21. The array of claim 1 wherein the conductive material has a planar elevationally outermost surface that is between the immediately adjacent conductive pillars between the immediately adjacent vias.

22. The array of claim 1 wherein the conductive material has two spaced planar elevationally outermost surfaces that are between the immediately adjacent conductive pillars between the immediately adjacent vias.

23. The array of claim 1 wherein the conductive material has two spaced planar elevationally outermost surfaces that individually join with and at opposite ends of the concave arcuate elevationally outer surface between the immediately adjacent conductive pillars between the immediately adjacent vias.

24. The array of claim 1 wherein the conductive metal material has a convex arcuate elevationally inner surface between the immediately adjacent conductive pillars between the immediately adjacent vias.

25. An array of memory cells, comprising:
   buried access lines comprising conductively doped semiconductor material;
   pillars extending elevationally outward of and spaced along the buried access lines, the pillars individually comprising a memory cell;
   outer access lines elevationally outward of the pillars and the buried access lines, the outer access lines being of higher electrical conductivity than the buried access lines;
   a plurality of conductive vias spaced along and electrically coupling pairs of individual of the buried and outer access lines, a plurality of the pillars being between immediately adjacent of the vias along the pairs; and
   electrically conductive metal material directly against tops of the buried access lines and extending between the pillars along the individual buried access lines, the conductive metal material having a convex arcuate elevationally inner surface that is between immediately adjacent of the conductive pillars between the immediately adjacent vias.

* * * * *